United States Patent [19]

Fong et al.

[11] Patent Number: 5,725,675
[45] Date of Patent: Mar. 10, 1998

[54] SILICON CARBIDE CONSTANT VOLTAGE GRADIENT GAS FEEDTHROUGH

[75] Inventors: Gary L. Fong, Sunnyvale; Vincente Lim, Newark; Visweswaren Sivaramakrishnan, Santa Clara, all of Calif.

[73] Assignee: Applied Materials, Inc., Santa Clara, Calif.

[21] Appl. No.: 632,877

[22] Filed: Apr. 16, 1996

[51] Int. Cl.$^6$ ............................................. C23C 16/00
[52] U.S. Cl. .................. 118/723 E; 118/715; 338/20; 338/21
[58] Field of Search .................... 118/723 E, 715; 338/20, 21

[56] References Cited

U.S. PATENT DOCUMENTS

| | | | |
|---|---|---|---|
| 573,558 | 12/1896 | Voss | 392/485 |
| 2,150,167 | 3/1939 | Hutchins et al. | 252/516 |
| 2,329,085 | 9/1943 | Ridgway | 252/516 |
| 4,549,161 | 10/1985 | McTavish et al. | 338/20 |
| 5,000,113 | 3/1991 | Wang et al. | 118/723 E |
| 5,557,250 | 9/1996 | Debbaut et al. | 338/21 |

*Primary Examiner*—Richard Bueker
*Attorney, Agent, or Firm*—Patterson & Streets, L.L.P.

[57] ABSTRACT

A method and apparatus is provided to prevent energy transfer to a gas which is flown through a gas line disposed between a biased member and grounded member. In one aspect of the invention, a semi-conductive sleeve, such as a silicon carbide sleeve, is provided which is disposed about a gas line and is in contact with the gas inlet manifold and the gas outlet manifold and has a resistance less than that of the gas which is flown through the gas line.

12 Claims, 3 Drawing Sheets

5,725,675

SILICON CARBIDE CONSTANT VOLTAGE GRADIENT GAS FEEDTHROUGH

BACKGROUND OF THE INVENTION

1. Field of the Invention

The present invention relates to a gas feedthrough to provide processing gases into a processing chamber. More specifically, the present invention relates to a constant voltage gradient gas feedthrough designed to provide a constant resistance under high radio frequency (RF) power to maintain process gas integrity through a given channel length.

2. Background of the Related Art

In the fabrication of integrated circuits, chemical vapor deposition (CVD) is a well known process for depositing conducting, semiconducting and dielectric materials on semiconductor substrates. Typically, CVD processes require that process gases be delivered into the chamber where they undergo chemical reactions to form the desired film layer on the surface of a substrate. Gas distribution plates are commonly utilized in CVD chambers to uniformly distribute the gas upon its introduction into the chamber. Such a uniform gas distribution is necessary to achieve uniform deposition characteristics upon the surface of the substrate located in the chamber. In some CVD applications, an electrical current is applied to a gas outlet manifold on the gas distribution plate which introduces the process gases into the chamber. Typically, an RF power source provides an energy potential to the output manifold which delivers gases into the chamber. The RF power generates a plasma within the chamber by exciting the process gases into a plasma state. Once excited, the precursor gases react within the chamber and the desired film typically deposits on the surface of the substrate.

In applications where gases are introduced into the chamber through a gas distribution plate having an RF hot outlet manifold, it is necessary to prevent the energy applied to the outlet manifold from being transferred to the gases being inlet into the chamber. Typically, a grounded gas inlet manifold is provided upstream of the biased gas outlet manifold which provides the gases into the chamber and an insulative block is positioned therebetween to house gas lines which are typically made of quartz. A resistive sleeve is disposed around the gas lines to shunt the energy applied to the outlet manifold away from the gases flown through the gas lines while providing resistive path between the biased inlet manifold and the grounded outlet manifold. The resistive sleeve is preferably held in place between the grounded gas inlet manifold and the RF hot gas outlet manifold by spring washers located at both ends of the sleeve.

Typically, a resistive sleeve of a composite material has been positioned between the grounded manifold and the RF hot manifold to provide a path of least resistance to the energy which is applied to the gas outlet manifold. However, the composite material currently being used requires that a metal contact be formed on the ends of the resistive sleeve to facilitate transfer of energy from the RF hot manifold to the resistive sleeve. The ends of the composite sleeves must undergo a metallization process to provide contacts which abut the inlet and outlet manifolds. It has been found that over time, the contacts formed on the ends of the composite sleeves by metallization wear out or break down under high power applications, thereby compromising the function of the resistive sleeve and altering the impedance of the CVD chamber.

If energy is transferred to the gas, the electrical configuration of the chamber may be altered, thereby adversely affecting the operation of the chamber. For example, if the energy applied to the gas outlet manifold is transferred to the gas, an unstable situation can result thus affecting the characteristic chamber impedance in an unpredictable manner.

Therefore, there remains a need to provide a resistive sleeve for use in a gas feedthrough which does not require formation of metal contacts on the ends thereof and is made of a material which has improved electromigration performance so that a constant voltage gradient can be maintained thereacross. It would be desirable to provide a single, unitary structure through which a gas line may be disposed to shunt the energy potential thereacross and to the grounded manifold.

SUMMARY OF THE INVENTION

The present invention provides a resistive sleeve for use in a gas feedthrough comprising a material which has an electrical resistance less than that of a gas which is flown through a gas line around which the sleeve is disposed. This sleeve is characterized by good resistance to electromigration and is preferably made of a homogeneous material.

In one aspect of the invention, a resistive sleeve is provided which is made of a semi-conductive material, such as silicon carbide.

In another aspect of the invention, a method is provided to shunt energy away from a gas flown through a gas line by providing a sleeve around a gas line and between the grounded manifold and the RF hot manifold, where the sleeve is made of a resistive material which is less resistive than the gas.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

The present invention generally provides a method and apparatus for preventing the transfer of energy from a gas manifold or other gas inlet member to a gas which is flown therethrough. Preferably an alternative resistive path, which is less resistive than the gases flown through the gas line, is provided between the grounded inlet gas manifold and the biased gas outlet manifold so that the energy will not be transferred to the gases. Specifically, the inventors have discovered that a resistive sleeve made of a semi-conductive material, such as silicon carbide, can be disposed between the gas inlet manifold and gas outlet manifold around the gas lines positioned therebetween to provide a resistive path which prevents transfer of the energy to gases flown through the gas lines. The semi-conductive sleeve provides improved electromigration performance and eliminates the problems encountered as a result of metallization of the ends of a composite material to form metal contacts on the ends thereof. The resistive sleeve also provides a constant resistance under high power radio frequency (RF) to maintain gas integrity through a given gas line length.

Figure 1:
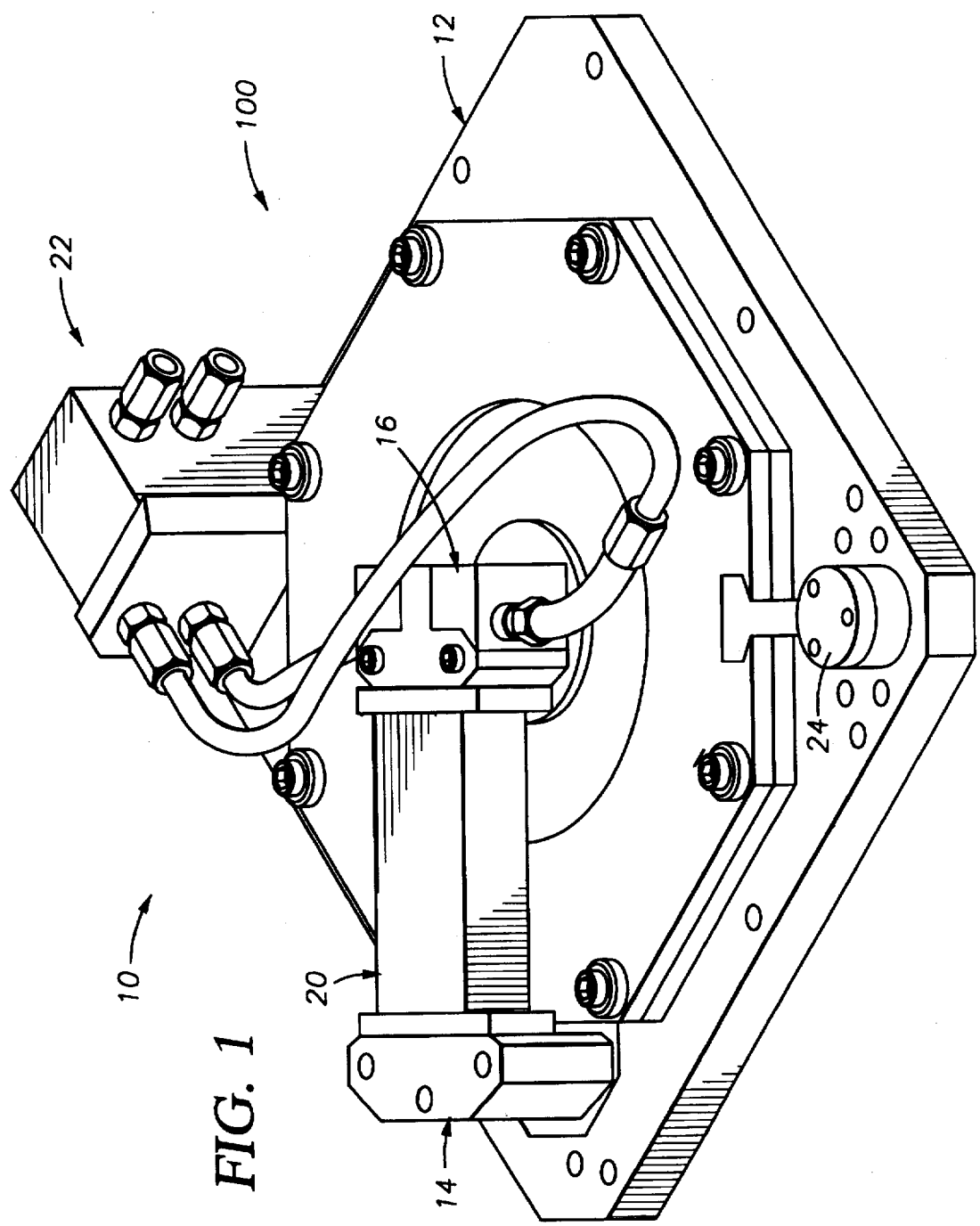
FIG. 1 is a schematic view of a gas distribution plate.

Referring to FIG. 1, a perspective view of a gas distribution plate 10 is shown. The gas distribution plate 10 generally includes a base plate 12, a gas input manifold 14 to which a gas source is connected, a gas output manifold 16 which receives gases from the gas inlet and introduces the gases into the chamber, at least one gas line 18 (shown in FIG. 2) connecting the gas inlet manifold and the gas outlet manifold, an insulating block 20 disposed around the gas lines, and a water manifold 22 to cool the gas distribution plate 10. The components of the gas distribution plate are described in detail in U.S. patent application Ser. No. 08/238,598, entitled "Temperature Controlled Gas Distribution Plate," filed on May 5, 1994, which application is hereby incorporated by reference.

Typically, the gas input manifold 14 is grounded and the gas output manifold 16 is RF hot to provide an electrical potential within the chamber which facilitates generation of a plasma within the chamber. Gases are supplied from a gas source (not shown) to the chamber through the input gas manifold 14, then through the gas line 18 and into the gas output manifold 16 wherein the gases are evenly distributed over the surface of a substrate positioned within the chamber, typically through a showerhead assembly.

Figure 2:
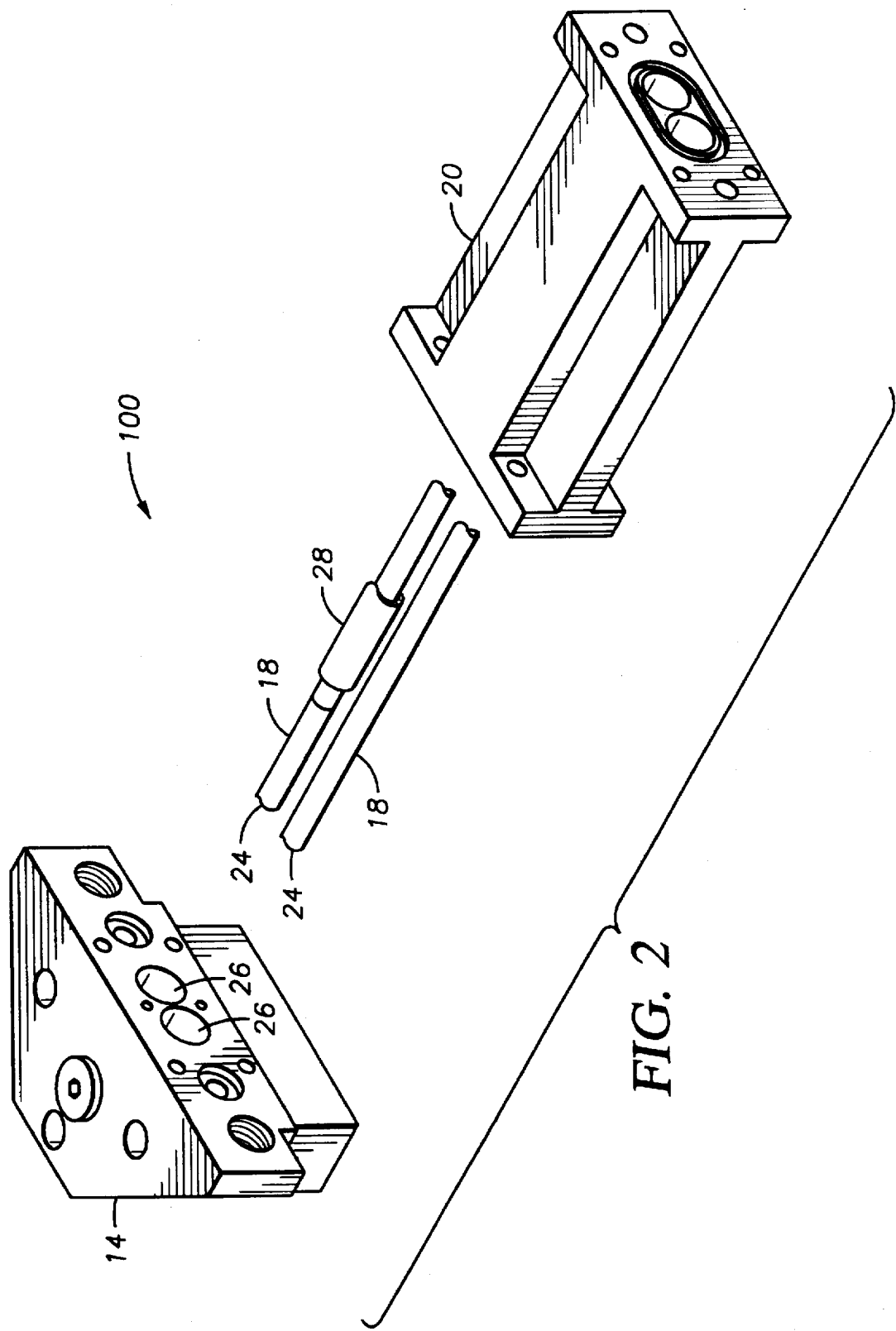
FIG. 2 is an exploded view of a dual gas feedthrough having a resistive sleeve of the present invention located thereon.

Referring to FIG. 2, an exploded view of a dual gas feedthrough 100 is provided. The gas lines 18 are typically made of a dielectric material such as quartz and extend between the gas inlet manifold 14 and the gas outlet manifold 16. The ends of the gas lines 24 are recessed in a channel 26 formed in both the inlet and outlet manifolds (FIG. 2 depicts the channels in the inlet gas manifold) and secured therein by a spring washer (shown in FIG. 3). The gas lines 18 are disposed in the insulating block 20 which is positioned between the input and output manifolds to prevent arcing between the two gas manifolds. A resistive sleeve 28 according to the present invention is positioned on the gas lines 18 in electrical communication with both the gas inlet manifold 14 and the gas outlet manifold 16 to provide a resistive path for energy transfer therethrough which prevents energy transfer through the gas flown through the gas lines 18. The resistive sleeve 28 has a resistance less than the resistance of the gases which are flown through the gas lines so that the energy which is applied to the output manifold 16 is not transferred to the gases. The inventors have discovered that a resistive sleeve made of a semi-conductive material, such as silicon carbide eliminates the metallization required for composite sleeves presently used to form electrical contacts thereby, eliminating failure of the resistive sleeve. In addition to silicon carbide, other semi-conductive homogenous materials, such as zirconium oxide, and which do not require metallization to form electrical contacts on the ends thereof, may be used.

Figure 3:
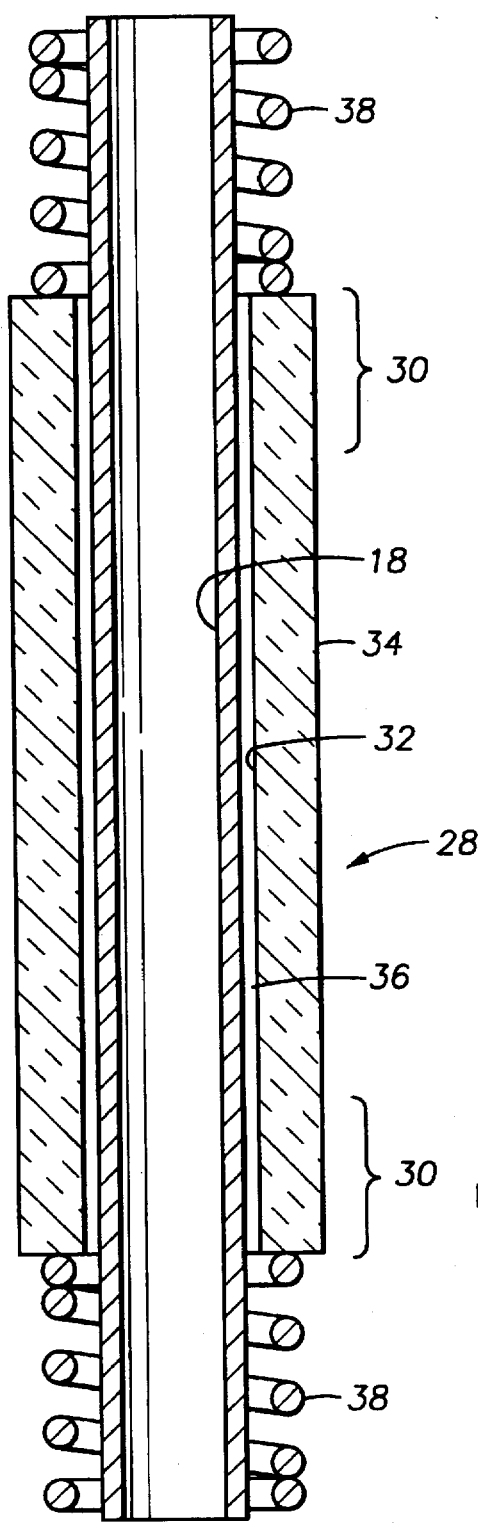
FIG. 3 is a longitudinal cross section of a resistive sleeve of the present invention having a gas line disposed therein.

Referring to FIG. 3, a longitudinal cross section of a resistive sleeve 28 of the present invention is shown disposed around gas line 18. The ends 30 of the sleeve 28 provide an electrical contact at each end thereof to contact the inlet manifold 14 and the outlet manifold 16 and provide a resistive path therebetween. The sleeve 28 includes an elongated inner wall 32 and an outer wall 34. The inner wall 32 defines a passage 36 through the sleeve 28 through which gas line 18 extends. The outer wall of the gas line 18 is spaced from the inner wall of the sleeve 28. The sleeve 28 is positioned over the gas line 18 and the gas line is securely fastened to the inlet and outlet manifolds in recesses formed therein. A spring washer 38 is disposed at either end of the sleeve 28 to secure the sleeve 28 between the gas inlet and outlet manifolds. The spring washers are recessed in the channels 26 formed in the manifolds to prevent the sleeve 28 from sliding along the length of the gas line 18 and to space the sleeve from the gas line.

Figure 4:
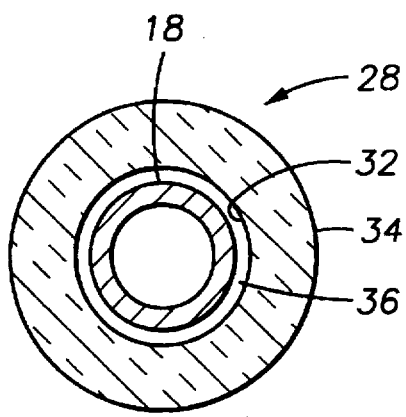
FIG. 4 is cross section of a resistive sleeve of the present invention having a gas line disposed therein.

Referring to FIG. 4, a cross section of the sleeve 28 and gas line 18 is shown. A space is maintained between the outer wall of the gas line 18 and the inner wall 32 of the sleeve 28. While the foregoing description refers to a sleeve, it is to be understood that any geometry is applicable, so long as the path of least resistance is through the resistive member.

Figure 5:
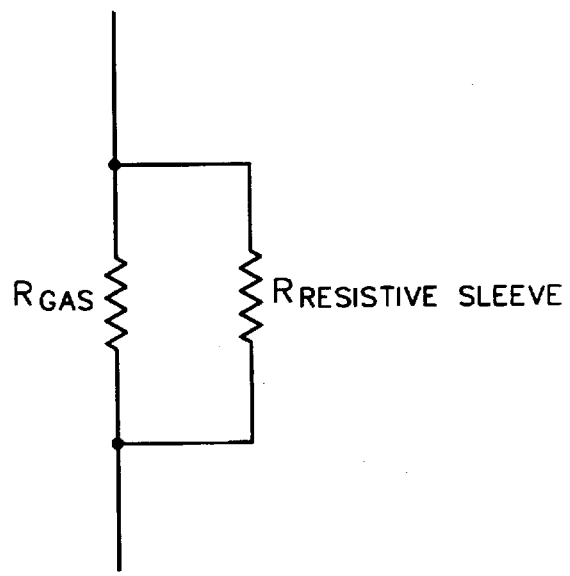
FIG. 5 is a simplified circuit diagram showing the pathway provided by the resistive sleeve.

Typically during processing, 1000 W to 1500 W are applied to the gas outlet manifold 16 to provide a plasma source within the chamber. The effect of the sleeve 28 is shown in the circuit diagram of FIG. 5 where:

$R_{resistive\ sleeve} < R_{gas}$

The energy applied to the outlet gas manifold is transferred through the resistive sleeve 28, which exhibits less resistance than the gases flown through the gas lines 18.

While the foregoing is directed to the preferred embodiment of the present invention, other and further embodiments of the invention may be devised without departing from the basic scope thereof, and the scope thereof is determined by the claims which follow.

We claim:

1. An apparatus for preventing the transfer of energy to a gas flown through a gas line, comprising:

a) a resistive member consisting essentially of a semi-conductive homogeneous material, the resistive member having a first end for contacting a biased member and a second end for contacting a grounded member, said resistive member defining a void therein along its length to house a gas line therethrough.

2. The apparatus of claim 1, wherein the resistive member is an annular sleeve.

3. The apparatus of claim 2, wherein the sleeve is made of silicon carbide.

4. The apparatus of claim 1, wherein the resistance of the resistive member is less than the gas which is flown through the gas line.

5. The apparatus of claim 4, wherein the resistive member is an annular sleeve.

6. The apparatus of claim 1, wherein the resistive member is a unitary body.

7. An apparatus for providing a gas to a processing chamber, comprising:

a) a gas inlet manifold into which process gases are introduced from a gas source;

b) a gas outlet manifold which is connected to a power source and provides an inlet into the chamber;

c) at least one gas line extending between the gas inlet and the gas outlet;

d) an insulative housing disposed about the gas line; and e) a resistive member consisting essentially of a semiconductive homogenous material, the resistive member disposed about the gas line to prevent the transfer of energy applied to the gas outlet from being transferred to the gas in the gas line.

8. The apparatus of claim 7, wherein the resistive member is an annular sleeve.

9. The apparatus of claim 8, wherein the sleeve is made of silicon carbide.

10. The apparatus of claim 7, wherein the resistance of the resistive member is less than the gas which is flown through the gas line.

11. The apparatus of claim 7, wherein the resistive member is a unitary body.

12. The apparatus of claim 11, wherein the resistive member is an annular sleeve.

* * * * *